United States Patent
Nicklaus et al.

(10) Patent No.: US 12,394,992 B2
(45) Date of Patent: Aug. 19, 2025

(54) METHOD FOR INTERACTING WITH AT LEAST ONE USER OF A RECHARGEABLE-BATTERY-OPERATED MACHINING TOOL, AND SYSTEM FOR CARRYING OUT THE METHOD

(71) Applicant: Robert Bosch GmbH, Stuttgart (DE)

(72) Inventors: Mischa Nicklaus, Stuttgart (DE); Helge Kuebler, Aichtal (DE)

(73) Assignee: Robert Bosch GmbH, Stuttgart (DE)

( * ) Notice: Subject to any disclaimer, the term of this patent is extended or adjusted under 35 U.S.C. 154(b) by 673 days.

(21) Appl. No.: 17/757,852

(22) PCT Filed: Nov. 16, 2020

(86) PCT No.: PCT/EP2020/082204
§ 371 (c)(1),
(2) Date: Jun. 22, 2022

(87) PCT Pub. No.: WO2021/129979
PCT Pub. Date: Jul. 1, 2021

(65) Prior Publication Data
US 2023/0026737 A1    Jan. 26, 2023

(30) Foreign Application Priority Data
Dec. 27, 2019   (DE) .................. 10 2019 220 592.5

(51) Int. Cl.
*H02J 7/00*   (2006.01)
*G01R 31/36*   (2020.01)
(Continued)

(52) U.S. Cl.
CPC ...... *H02J 7/00034* (2020.01); *G01R 31/3646* (2019.01); *G01R 31/371* (2019.01);
(Continued)

(58) Field of Classification Search
CPC .... H02J 7/00034; H02J 7/0048; H02J 7/0063; G01R 31/3646; G01R 31/371
(Continued)

(56) References Cited

U.S. PATENT DOCUMENTS

| | | | |
|---|---|---|---|
| 2007/0069692 A1* | 3/2007 | Melichar | H01M 10/4207 320/128 |
| 2010/0176766 A1 | 7/2010 | Brandner et al. | |

(Continued)

FOREIGN PATENT DOCUMENTS

| | | |
|---|---|---|
| AU | 2019200218 A1 | 8/2019 |
| WO | 2012/114749 A1 | 8/2012 |
| WO | 2013/029825 A1 | 3/2013 |

OTHER PUBLICATIONS

International Search Report corresponding to PCT Application No. PCT/EP2020/082204, mailed Feb. 18, 2021 (German and English language document) (5 pages).

*Primary Examiner* — Nathaniel R Pelton
(74) *Attorney, Agent, or Firm* — Maginot, Moore & Beck LLP

(57) ABSTRACT

The disclosure relates to a method for interacting with a user of a rechargeable-battery-operated machining tool, which can be supplied with energy by means of an exchangeable rechargeable battery pack or exchangeable rechargeable battery. According to the disclosure, in one method step a power characteristic variable of the exchangeable rechargeable battery pack or exchangeable rechargeable battery is sensed by means of a sensing unit of the rechargeable-battery-operated machining tool and/or of the exchangeable rechargeable battery pack or exchangeable rechargeable battery at defined times during the operation of the rechargeable-battery-operated machining tool, and in an additional method step the frequency with which the exchangeable rechargeable battery pack or exchangeable rechargeable (Continued)

battery has been operated at its power limit is calculated. The disclosure also relates to a system, comprising a rechargeable-battery-operated machining tool and an exchangeable rechargeable battery pack or exchangeable rechargeable battery, for carrying out the method.

16 Claims, 2 Drawing Sheets

(51) Int. Cl.
    *G01R 31/371*     (2019.01)
    *H04L 67/55*     (2022.01)

(52) U.S. Cl.
    CPC .......... *H02J 7/0048* (2020.01); *H02J 7/0063* (2013.01); *H04L 67/55* (2022.05)

(58) Field of Classification Search
    USPC ........................................................ 320/127
    See application file for complete search history.

(56) References Cited

U.S. PATENT DOCUMENTS

| | | |
|---|---|---|
| 2011/0140668 A1* | 6/2011 | Anderson ............. H01M 10/44 320/134 |
| 2013/0098646 A1 | 4/2013 | Funabashi et al. |
| 2013/0255980 A1 | 10/2013 | Linehan et al. |
| 2014/0151079 A1 | 6/2014 | Furui et al. |
| 2016/0226278 A1 | 8/2016 | Wenger et al. |

* cited by examiner

METHOD FOR INTERACTING WITH AT LEAST ONE USER OF A RECHARGEABLE-BATTERY-OPERATED MACHINING TOOL, AND SYSTEM FOR CARRYING OUT THE METHOD

This application is a 35 U.S.C. § 371 National Stage Application of PCT/EP2020/082204, filed on Nov. 16, 2020, which claims the benefit of priority to Serial No. DE 10 2019 220 592.5, filed on Dec. 27, 2019 in Germany, the disclosures of which are incorporated herein by reference in their entirety.

The disclosure relates to a method for interacting with at least one user of a rechargeable-battery-operated machining tool, and to a system for carrying out the method.

BACKGROUND

Rechargeable-battery-operated machining tools are offered in a wide variety of power classes depending on their envisaged use. In this regard, there are for example handheld power tools in lower power classes which are operated with 10.8 V (nominally often also referred to as 12 V) or 14.4 V, while machining tools in voltage classes of 18 V, 36 V, 54 V or else 72 V are predominantly used in the medium to higher power classes. In this case, the voltage values result from the interconnection (in parallel or in series) of the rechargeable battery cells used.

Preferably, the rechargeable battery cells are embodied in this case as lithium-based rechargeable battery cells, e.g. Li-ion, Li—Po, Li-metal or the like, having a cell voltage of 3.6 V, wherein a rechargeable battery cell is generally a cylindrical round cell, the cell terminals of which are arranged at ends of the cylinder shape. However, the following disclosure is not dependent on the type and design of the rechargeable battery cells used, but rather can be applied to any desired exchangeable rechargeable battery packs and exchangeable rechargeable batteries, e.g. besides round cells also pouch cells or the like.

In order to ensure the longest possible operating times and the shortest possible pause times in industrial applications, in particular, exchangeable rechargeable batteries or exchangeable rechargeable battery packs have become established in the case of many rechargeable-battery-operated machining tools. They are releasably connected to one another in a force-locking and/or positively locking manner via corresponding interfaces at the exchangeable rechargeable battery packs and the electric machining tools. A "releasable connection" should be understood to mean in particular a connection that is releasable and producible without the use of tools—i.e. by hand.

AU 2019200218 A1 discloses a rechargeable-battery-operated electric power tool comprising a control or regulating device for controlling or regulating an electric drive for an insert tool. The control or regulating device is configured in such a way that it can communicate with a tool-external unit. In this way, a plurality of rechargeable-battery-operated electric power tools can communicate with one another within the same network in order e.g. to exchange data about the operation of the electric power tools and to set a uniform control or regulating behavior. Inter alia, the data also include information about weak and/or drained exchangeable rechargeable battery packs or exchangeable rechargeable batteries.

Rechargeable-battery-operated machining tools for high-power applications, in particular, require exchangeable rechargeable battery packs or exchangeable rechargeable batteries having correspondingly high power reserves and a very high current-supplying capability. If a user uses such a machining tool in conjunction with an exchangeable rechargeable battery pack or exchangeable rechargeable battery having an excessively low current-supplying capability, then the rechargeable-battery-operated machining tool cannot fully utilize its performance, which results in unsatisfactory work progress for the user. Moreover, the user may be given the impression that the rechargeable-battery-operated machining tool is defective.

The problem addressed by the disclosure is that of improving the interaction of a user with a rechargeable-battery-operated machining tool in such a way that the user is informed when a power limit of at least one exchangeable rechargeable battery pack or exchangeable rechargeable battery used in conjunction with the rechargeable-battery-operated machining tool is repeatedly exceeded.

SUMMARY

The disclosure relates to a method for interacting with at least one user of a rechargeable-battery-operated machining tool, which is able to be supplied with energy by means of at least one exchangeable rechargeable battery pack or exchangeable rechargeable battery. In order to solve the problem addressed, it is provided that, in one method step a power characteristic variable of the at least one exchangeable rechargeable battery pack or exchangeable rechargeable battery is sensed by means of a sensing unit of the rechargeable-battery-operated machining tool and/or of the at least one exchangeable rechargeable battery pack or exchangeable rechargeable battery at defined points in time during the operation of the rechargeable-battery-operated machining tool, wherein in a further method step a frequency with which the at least one exchangeable rechargeable battery pack or exchangeable rechargeable battery has been operated at its power limit is calculated. Particularly advantageously, the user can thus be advised about the reason for a reduced performance of the rechargeable-battery-operated machining tool and about the use of appropriately powerful exchangeable rechargeable battery packs or exchangeable rechargeable batteries. For manufacturers, inquiries from users about a restricted performance of rechargeable-battery-operated machining tools can thus be reduced, which helps to save service costs in the context of guarantee or legal warranty claims.

In the context of the disclosure, rechargeable-battery-operated machining tools should be understood to mean for example electric power tools for machining workpieces by means of an electrically driven insert tool. In this case, the electric power tool can be embodied both as a hand-held electric tool and as a stationary electric power tool. Typical electric power tools in this context are hand-held or floor-standing drills, high-power screwdrivers, impact drills, hammer drills, planes, angle grinders, orbital sanders, polishing machines, circular saws, bench saws, miter saws and jigsaws or the like. However, possible rechargeable-battery-operated machining tools also include gardening tools such as lawnmowers, lawn trimmers, pruning saws or the like. Furthermore, the disclosure can also be used for exchangeable rechargeable battery packs or exchangeable rechargeable batteries of rechargeable-battery-operated domestic appliances such as vacuum cleaners, mixers, etc.

The rechargeable battery voltage of an exchangeable rechargeable battery pack is generally a multiple of the voltage of an individual rechargeable battery cell and results from the interconnection (in parallel or in series) of the individual rechargeable battery cells. A rechargeable battery cell is typically embodied as a galvanic cell having a construction in which one cell terminal is located at one end and a further cell terminal is located at an opposite end. In particular, the rechargeable battery cell has a positive cell terminal at one end and a negative cell terminal at an opposite end. Preferably, the rechargeable battery cells are embodied as lithium-based rechargeable battery cells, e.g. Li-ion, Li-Po, Li-metal or the like. However, the disclosure can also be applied to exchangeable rechargeable battery packs having Ni—Cd, Ni-MH cells or other suitable cell types. In the case of conventional Li-ion rechargeable battery cells having a cell voltage of 3.6 V, voltage classes of 3.6 V, 7.2 V, 10.8 V, 14.4 V, 18 V, 36 V, etc. arise, by way of example. Preferably, a rechargeable battery cell is embodied as an at least substantially cylindrical round cell, wherein the cell terminals are arranged at ends of the cylinder shape. However, the disclosure is not dependent on the type and design of the rechargeable battery cells used, but rather can be applied to any desired exchangeable rechargeable battery packs and exchangeable rechargeable batteries, e.g. besides round cells also pouch cells or the like.

It should furthermore be noted that the configuration of the electromechanical interfaces of the rechargeable-battery-operated machining tools and also the associated receptacles for the force-locking and/or positively locking releasable connection of the exchangeable rechargeable battery packs are not intended to be the subject of this disclosure. A person skilled in the art will choose a suitable embodiment for the interface depending on the power or voltage class of the rechargeable-battery-operated machining tool and/or of the exchangeable rechargeable battery packs.

For data transfer, the rechargeable-battery-operated machining tool comprises a communication device, by way of which said tool transmits data to a communication device of a tool-external unit, in particular of a smartphone, of a tablet, of a computer, of a cloud server or of some other computing unit. In this case, in a further method step the tool-external unit generates advice for the use of a more powerful exchangeable rechargeable battery pack or exchangeable rechargeable battery on the basis of the data containing the calculated frequency. Said advice can be indicated to the at least one user in a further method step by way of a text, image and/or voice message, in particular as a push message. In this way, the user can be rapidly, transparently and efficiently advised about the problem in connection with the exchangeable rechargeable battery packs or exchangeable rechargeable batteries used by said user and eliminate the cause by automatically purchasing more powerful exchangeable rechargeable battery packs or exchangeable rechargeable batteries.

A tool-external unit should be understood to mean everything which, on the one hand, can communicate with the rechargeable-battery-operated machining tool via a corresponding communication device and which, on the other hand, can be operated in particular energy-autonomously and in a manner mechanically decoupled from the rechargeable-battery-operated machining tool.

The communication device of the rechargeable-battery-operated machining tool can be embodied in particular as a radio module, for example as a Bluetooth or Bluetooth low energy module, as a WLAN module, an infrared module, an LoRa module, an NFC module or as some other wireless communication device that seems expedient to a person skilled in the art. Preferably, the communication device is arranged in a positionally fixed manner in a housing of the rechargeable-battery-operated machining tool, in particular is releasable from the housing and/or further components of the rechargeable-battery-operated machining tool only with the use of a tool. The communication device of the tool-external unit has the same radio technology as the communication device of the rechargeable-battery-operated machining tool. Since corresponding communication devices are known to the person skilled in the art, they will not be discussed further at this juncture.

Alternatively or supplementarily, it is provided that the rechargeable-battery-operated machining tool comprises an internal computing unit, which generates advice for the use of a more powerful exchangeable rechargeable battery pack or exchangeable rechargeable battery on the basis of the calculated frequency in a further method step. In this case, the advice can be indicated to the at least one user visually, acoustically and/or haptically by means of an indicator unit of the rechargeable-battery-operated machining tool. Particularly advantageously, therefore, a possibly excessively low-powered exchangeable rechargeable battery pack or exchangeable rechargeable battery is indicated directly by the rechargeable-battery-operated machining tool, such that the user is already informed about the problem during the machining of a workpiece. In this case, a visual indication can be effected by way of illuminants (e.g. a multicolor LED or a multistage LED indicator) and/or a display (e.g. LCD, OLED, ePaper or the like).

An internal computing unit should be understood to mean in particular a unit comprising a processor and comprising a memory and also comprising an operating program stored in the memory. Preferably, the internal computing unit is at least partly embodied as a microcontroller or comprises at least one microcontroller having a computing power that enables operation of a real-time operating system.

The at least one user can deactivate the indication of the advice in a further method step. Alternatively or supplementarily, it is also possible for the indication of the advice to be deactivated after a defined number of repetitions in a further method step. Firstly, this allows the conclusion to be drawn that the at least one user has deliberately ignored the advice so as to be able to continue to work with the rechargeable-battery-operated machining tool despite reduced performance. Secondly, the active deactivation of the advice also allows the at least one user not to be disturbed by excessively frequent notification. Furthermore, it can be provided that the advice is automatically indicated again after a defined time period in which it is was not indicated, and/or that the advice can be passed on to other users of the rechargeable-battery-operated machining tool. This is advantageous in particular if a plurality of users use the same rechargeable-battery-operated machining tool.

Moreover, it can be provided that the at least one user can set the rechargeable-battery-operated machining tool in such a way that said tool is operable at least for a defined time period only with reduced power adapted to the power limit of the at least one exchangeable rechargeable battery pack or exchangeable rechargeable battery. In this way, the user can adapt the current consumption of the rechargeable-battery-operated tool to the exchangeable rechargeable battery pack used. In addition, it is thus possible to prevent the exchangeable rechargeable battery pack or exchangeable rechargeable battery from permanently losing its maximum charging capacity as a result of overheating, for example.

The disclosure furthermore relates to a system comprising a rechargeable-battery-operated machining tool and an exchangeable rechargeable battery pack or exchangeable rechargeable battery for carrying out the method according to the disclosure. In conjunction with a tool-external unit, in particular a smartphone, a tablet, a computer, a cloud server or some other computing unit, it can be provided that individual method steps of the method are carried out on the tool-external unit. This last allows firstly the use of rechargeable-battery-operated machining tools without a complex and expensive internal computing unit and secondly the simple processing and forwarding of the information by a corresponding backend even when the rechargeable-battery-operated machining tool is switched off. In addition, in this way, a plurality of users of the rechargeable-battery-operated machining tool can be rapidly and efficiently informed about the calculated frequency with which the at least one exchangeable rechargeable battery pack or exchangeable rechargeable battery has been operated at its power limit.

BRIEF DESCRIPTION OF THE DRAWINGS

The disclosure is explained by way of example below with reference to FIGS. 1 and 2, wherein identical reference signs in the figures refer to identical constituent parts having an identical functioning.

In the figures.

DETAILED DESCRIPTION

Figure 1:
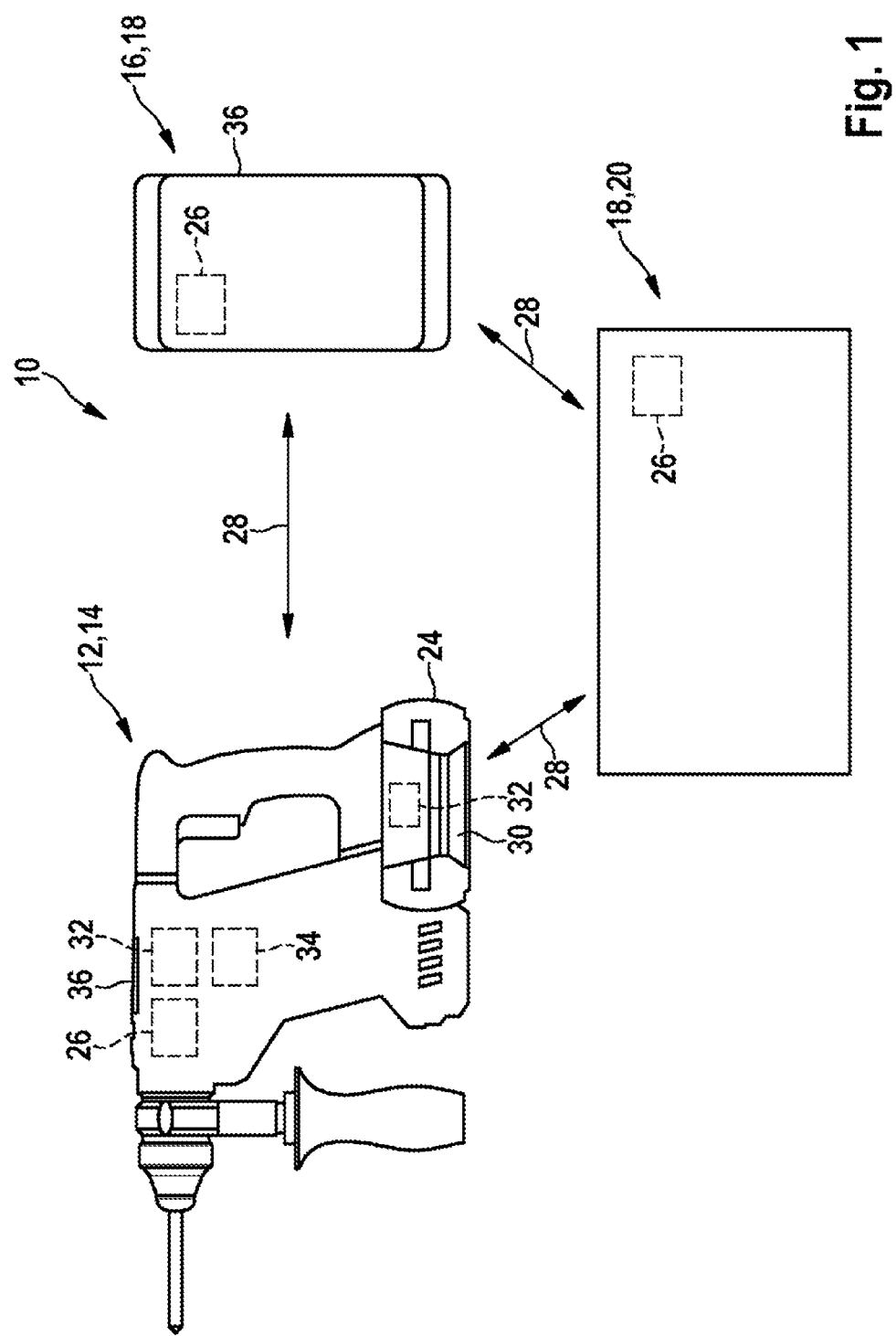
FIG. 1 shows a schematic illustration of a system according to the disclosure for carrying out the method according to the disclosure for interacting with at least one user of a rechargeable-battery-operated machining tool.

FIG. 1 shows a system 10 comprising a rechargeable-battery-operated machining tool 14 embodied as a rechargeable battery hammer drill 12, a first tool-external unit 18 embodied as a smartphone 16, and a second tool-external unit 18 embodied as an IoT or cloud server 20. However, other configurations of the system 10 are also conceivable, particularly in regard to the type and number of the rechargeable-battery-operated machining tools 14 and the tool-external units 18.

The rechargeable battery hammer drill 12 is supplied with energy by means of at least one exchangeable rechargeable battery pack or exchangeable rechargeable battery 24. The exchangeable rechargeable battery pack or exchangeable rechargeable battery 24 is a conventional exchangeable rechargeable battery pack or exchangeable rechargeable battery comprising a housing 30 having, on a first side wall, an electromechanical interface (not shown in more specific detail) for releasable connection to a rechargeable battery interface (likewise not shown in more specific detail) of the rechargeable battery hammer drill 12 and to a charger (not shown). In conjunction with the rechargeable battery hammer drill 12, the electromechanical interface of the at least one exchangeable rechargeable battery pack 24 serves for discharging, while in conjunction with the charger, said interface enables charging of the at least one exchangeable rechargeable battery pack 24. However, alternatively or supplementarily, the charging can also be effected directly via the rechargeable battery interface of the rechargeable battery hammer drill 12. The exact configuration of the electromechanical interface and of the rechargeable battery interface is dependent on various factors, such as, for example, the voltage class of the exchangeable rechargeable battery pack 24 or diverse manufacturer specifications. In this regard, provision can be made of e.g. two or more electrical contacts for energy and/or data transfer between the at least one exchangeable rechargeable battery pack 24 and the rechargeable battery hammer drill 12 and respectively the charger. Moreover, a mechanical coding is conceivable, such that the at least one exchangeable rechargeable battery pack 24 is operable only on specific rechargeable-battery-operated machining tools 14. Since the exact configuration of the electromechanical interface is unimportant for the disclosure, it will not be discussed in any further detail. Both a person skilled in the art and a user of the rechargeable-battery-operated machining tool 14 will make the suitable choice in this regard.

The individual components of the system 10 each have a communication device 26 provided for data transfer 28 within the system 10, in particular between the rechargeable-battery-operated machining tool 14, the first tool-external unit 18 and the second tool-external unit 18. The communication devices 26 can be designed for example for transferring WLAN and/or Bluetooth protocols. In this regard, it is conceivable for data to be exchanged between the rechargeable-battery-operated machining tool 14 and the first tool-external unit 18 embodied as a smartphone 16, by way of Bluetooth while the first and second tool-external units 18 communicate with one another via their respective communication devices 26 by way of WLAN or else by way of a wired ethernet connection. Other configurations of the communication devices 26 are also conceivable, for example for data transfer by way of LoRa, NFC or the like or alternatively by way of optical or acoustic coupling. Moreover, it is conceivable for the first and second tool-external units 18 to communicate via an Internet connection. This is the case for example if the second tool-external unit 18 is embodied as a remotely positioned cloud server 20. The various and diverse possibilities for the configuration of the first and second tool-external units 18 are known to the person skilled in the art, and so they will not be discussed any further here.

The rechargeable battery hammer drill 12 comprises a sensing unit 32, which senses a power characteristic variable P of the at least one exchangeable rechargeable battery pack or exchangeable rechargeable battery 24 at defined points in time during the operation of the rechargeable battery hammer drill 12. For this purpose, the sensing unit 32 can comprise at least one sensor element, which is not shown in more specific detail in the figures, however. The sensor element is embodied for example as a shunt resistor or some other sensor element for a current, voltage and/or temperature measurement that is suitable for sensing the power characteristic variable P of the at least one exchangeable rechargeable battery pack or exchangeable rechargeable battery 24. In this case, a power limit $P_T$ of the exchangeable rechargeable battery pack or exchangeable rechargeable battery 24 generally results from the maximum current-supplying capability thereof while complying with the temperature limit values. In addition, the exchangeable rechargeable battery pack or exchangeable rechargeable battery 24 can transfer its power limit $P_T$ and optionally further rechargeable-battery-specific parameters by way of a coding resistor or other suitable means, via its electromechanical interface and the rechargeable battery interface of the rechargeable battery hammer drill 12, to the rechargeable battery hammer drill 12. Alternatively or supplementarily, it is also possible for the power characteristic variable P to be sensed within the exchangeable rechargeable battery pack or exchangeable rechargeable battery 24 by means of a corresponding sensing unit 32. Furthermore, the rechargeable battery hammer drill 12 comprises an internal computing unit 34 for calculating or sensing a frequency F with which the at least one exchangeable rechargeable battery pack or exchangeable rechargeable battery 24 has been operated at its power limit $P_T$.

At least one of the tool-external units 18 and/or the rechargeable-battery-operated machining tool 14 comprise(s) an indicator unit 36 for outputting visual, acoustic and/or haptic signals. A visual output can be effected in this case by way of illuminants (e.g. a multicolor LED or a multistage LED indicator) and/or a display (e.g. LCD, OLED, ePaper or the like), while for example a loudspeaker serves for acoustic output and a vibration motor serves for haptic output.

Figure 2:
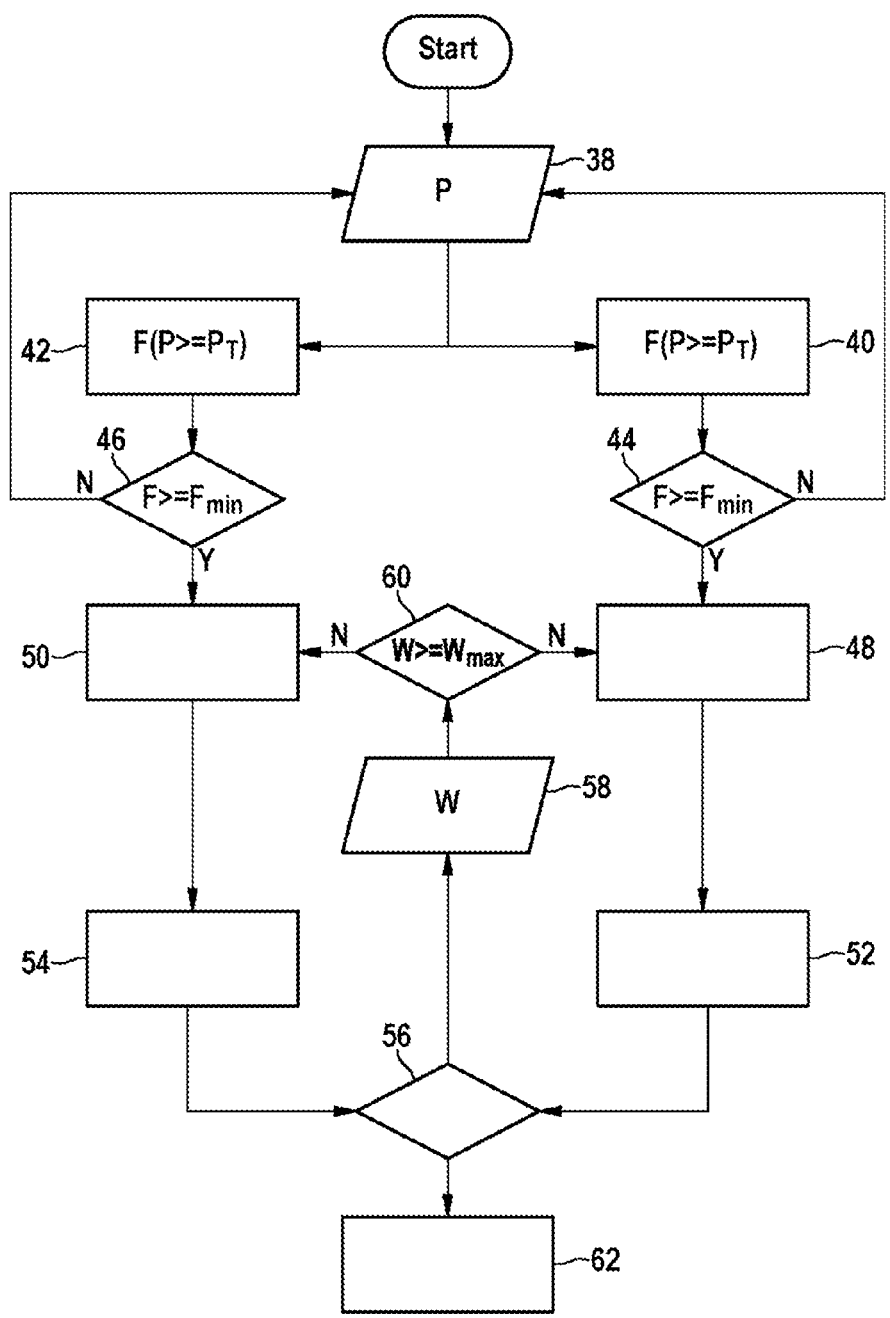
FIG. 2: shows a flow diagram of the method according to the disclosure for interacting with at least one user of a rechargeable-battery-operated machining tool.

FIG. 2 shows an exemplary sequence of the method according to the disclosure for interacting with at least one user of the rechargeable battery hammer drill 12 by means of the system 10. In this case, the processing of the individual method steps in the tool-external unit 18 is shown on the right-hand side and the processing of the corresponding method steps in the rechargeable battery hammer drill 12 or in the rechargeable-battery-operated machining tool 10 is shown on the left-hand side. In one method step 38 a power characteristic variable P of the at least one exchangeable rechargeable battery pack or exchangeable rechargeable battery 24 is sensed by means of the sensing unit 32 of the hammer drill 12 and/or of the at least one exchangeable rechargeable battery pack or exchangeable rechargeable battery 24 at defined points in time during the operation of the hammer drill 12. The power characteristic variable P is then transferred to the communication device 26 of the at least one tool-external unit 18, for example of the smartphone 16, by means of the communication device 26 of the rechargeable battery hammer drill 12. In a further method step 40, subsequently, the frequency F with which the at least one exchangeable rechargeable battery pack or exchangeable rechargeable battery 24 has been operated at its power limit $P_T$ is calculated. In this case, "at its power limit" can be interpreted as the power limit being reached or exceeded ($P>=P_T$) or as the power limit purely being exceeded ($P>P_T$). It is likewise conceivable for a threshold value for the frequency F to be defined as the power limit being approximately reached, where $F(P \cong P_T)$. Alternatively or supplementarily, it can also be provided that the frequency F is calculated by the computing unit 34 integrated in the rechargeable battery hammer drill 12 in a method step 42. For this purpose, the power limit $P_T$ of the exchangeable rechargeable battery pack or exchangeable rechargeable battery 24 connected to the rechargeable battery hammer drill 12 may have been communicated to the rechargeable battery hammer drill 12 by the exchangeable rechargeable battery pack or exchangeable rechargeable battery 24 in the manner described. In addition, the rechargeable battery hammer drill 12 can transmit this value to the tool-external unit 18 by means of its communication device 26.

As long as a defined minimum frequency $F_{min}$ has not been exceeded or reached, the power characteristic variable P is sensed further in accordance with steps 44 and/or 46. In the event of the calculated frequency exceeding or reaching the minimum frequency ($F>=F_{rain}$), advice for the use of a more powerful exchangeable rechargeable battery pack or exchangeable rechargeable battery 24 is generated in steps 48 and/or 50. Said advice can be indicated to the at least one user in a further method step 52 by way of a text, image and/or voice message, in particular as a push message, on the tool-external unit 18. In this way, the user can be rapidly, transparently and efficiently advised about the reason for a reduced performance of the rechargeable battery hammer drill 12 and about the use of appropriately more powerful exchangeable rechargeable battery packs or exchangeable rechargeable batteries 24. For the manufacturer of the rechargeable battery hammer drill, moreover, the advantage is afforded that the number of possible inquiries from users about a restricted performance of corresponding rechargeable-battery-operated machining tools 114 owing to the use of excessively low-powered exchangeable rechargeable battery packs or exchangeable rechargeable batteries decreases. Possible service costs in the context of guarantee or legal warranty claims can thus be saved.

On the basis of the sensed frequency F, in a further method step 54 the internal computing unit 34 of the rechargeable battery hammer drill 12 can also generate advice for the use of a more powerful exchangeable rechargeable battery pack or exchangeable rechargeable battery 24. Said advice can be output to the at least one user visually, acoustically and/or haptically by means of the indicator unit 36 of the rechargeable battery hammer drill 12, for example.

The at least one user can deactivate the indication of the advice in a further method step 56. Alternatively or supplementarily, it is also possible for the indication of the advice to be deactivated after a defined maximum number of repetitions $W_{max}$ in a further method step 60. This affords the user the possibility of deliberately suppressing the advice or the regular repetition W thereof in order to be able to continue to work with the rechargeable battery hammer drill 12 despite reduced performance. Moreover, provision can be made for the advice to be automatically indicated again after a defined time period in which it was not indicated, and/or to be passed on to other users of the rechargeable battery hammer drill 12. This is advantageous in particular if a plurality of users use the rechargeable battery hammer drill in turns.

Finally, the method according to the disclosure can provide that the at least one user can set the rechargeable battery hammer drill 12 in a further method step 62 in such a way that said drill is operable at least for a defined time period only with reduced power adapted to the power limit $P_T$ of the at least one exchangeable rechargeable battery pack or exchangeable rechargeable battery 24. In this way, the user can adapt the current consumption of the rechargeable battery hammer drill 12 to the exchangeable rechargeable battery pack 24 used, in order that the latter is not permanently damaged.

The invention claimed is:

1. A method for interacting with at least one user of a rechargeable-battery-operated machining tool, the rechargeable-battery-operated machining tool being supplied with energy by at least one exchangeable rechargeable battery, the method comprising:

sensing a power characteristic variable of the at least one exchangeable rechargeable battery at defined points in time during an operation of the rechargeable-battery-operated machining tool using a sensing unit of at least one of (i) the rechargeable-battery-operated machining tool and (ii) the at least one exchangeable rechargeable battery, and calculating a frequency with which the at least one exchangeable rechargeable battery has been operated at a power limit of the at least one exchangeable rechargeable battery.

2. The method as claimed in claim 1, wherein the rechargeable-battery-operated machining tool comprises a first communication device configured to transmit data to a second communication device of a tool-external unit, the method further comprising:

generating, with the tool-external unit, advice for use of a more powerful exchangeable rechargeable battery based on the data, the data containing the calculated frequency.

3. The method as claimed in claim 2 further comprising: indicating the advice to the at least one user by way of at least one of a text message, an image message, and a voice message.

4. The method as claimed in claim 1, wherein the rechargeable-battery-operated machining tool comprises an internal computing unit, the method further comprising: generating, with the internal computing unit, advice for use of a more powerful exchangeable rechargeable battery based on the calculated frequency.

5. The method as claimed in claim 2 further comprising: indicating the advice to the at least one user at least one of visually, acoustically, and haptically using an indicator unit of the rechargeable-battery-operated machining tool.

6. The method as claimed in claim 3, wherein the at least one user can deactivate the indicating of the advice.

7. The method as claimed in claim 3 further comprising: deactivating the indicating of the advice after a defined number of repetitions.

8. The method as claimed in claim 1, wherein the at least one user can set the rechargeable-battery-operated machining tool such that the rechargeable-battery-operated machining tool is operable at least for a defined time period only with reduced power adapted to the power limit of the at least one exchangeable rechargeable battery.

9. The method as claimed in claim 1, wherein the at least one exchangeable rechargeable battery includes at least one exchangeable rechargeable battery pack.

10. The method as claimed in claim 2, wherein the first communication device is configured to wirelessly transmit the data to the second communication device of the tool-external unit.

11. The method as claimed in claim 2, wherein the tool-external unit is one of a smartphone, of a tablet, a computer, a cloud server, and a computing unit.

12. The method as claimed in claim 3, the indicating further comprising: indicating the advice to the at least one user by way of a push message.

13. A system comprising:
a rechargeable-battery-operated machining tool; and
an exchangeable rechargeable battery, the rechargeable-battery-operated machining tool being supplied with energy by the at least one exchangeable rechargeable battery,
wherein a power characteristic variable of the at least one exchangeable rechargeable battery is sensed at defined points in time during an operation of the rechargeable-battery-operated machining tool using a sensing unit of at least one of (i) the rechargeable-battery-operated machining tool and (ii) the at least one exchangeable rechargeable battery, and
wherein a frequency with which the at least one exchangeable rechargeable battery has been operated at a power limit of the at least one exchangeable rechargeable battery is calculated.

14. The system as claimed in claim 13, a tool-external unit is configured to calculate the frequency.

15. The system as claimed in claim 14, wherein the tool-external unit is one of a smartphone, of a tablet, a computer, a cloud server, and a computing unit.

16. The system as claimed in claim 13, wherein the at least one exchangeable rechargeable battery includes at least one exchangeable rechargeable battery pack.

* * * * *